(12) United States Patent
Yee

(10) Patent No.: US 7,033,914 B2
(45) Date of Patent: Apr. 25, 2006

(54) METHOD OF MAKING A PACKAGE STRUCTURE BY DICING A WAFER FROM THE BACKSIDE SURFACE THEREOF

(75) Inventor: Kuo-Chung Yee, Taipei (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 102 days.

(21) Appl. No.: 10/919,178

(22) Filed: Aug. 16, 2004

(65) Prior Publication Data

US 2005/0042844 A1 Feb. 24, 2005

(30) Foreign Application Priority Data

Aug. 20, 2003 (TW) ............................... 92122902 A

(51) Int. Cl.
*H01L 21/301* (2006.01)
(52) U.S. Cl. .................... 438/460; 438/113; 438/462; 438/458
(58) Field of Classification Search .................... None
See application file for complete search history.

(56) References Cited

U.S. PATENT DOCUMENTS

| 6,297,131 B1 * | 10/2001 | Yamada et al. ............. 438/464 |
| 6,528,393 B1 * | 3/2003 | Tao ............................. 438/460 |
| 6,869,861 B1 * | 3/2005 | Glenn et al. ................. 438/462 |

* cited by examiner

*Primary Examiner*—Luan Thai
(74) *Attorney, Agent, or Firm*—Ladas & Parry

(57) ABSTRACT

The present invention relates to a method of making a package structure by dicing a wafer from the backside surface thereof comprising: (a) providing a first wafer having a active surface, a backside surface and a plurality of scribe lines defining a plurality of chips, wherein each chip has an annular body thereon; (b) dicing the first wafer from the active surface to form a reference coordinate; (c) providing a second wafer; (d) covering and joining the second wafer to the first wafer to form a plurality of cavities; and (e) dicing the corresponding positions of the scribe lines of the first wafer from the backside surface thereof according to the predetermined distance from the reference coordinate so as to form an individual package structure. As a result, the manufacture time is reduced.

24 Claims, 3 Drawing Sheets

METHOD OF MAKING A PACKAGE STRUCTURE BY DICING A WAFER FROM THE BACKSIDE SURFACE THEREOF

BACKGROUND OF THE INVENTION

1. Field of the Invention

The present invention relates to a method of making a package structure, particularly to a method of making a package structure by dicing a wafer from the backside surface thereof.

2. Description of the Related Art

FIG. 1 shows a cross sectional view of a conventional wafer level package structure. The conventional wafer level package structure is made by the following steps.

First, a first wafer 10 having an active surface 12 and a backside surface 14 is provided, and the active surface 12 has a plurality of scribe lines 16 defining a plurality of chips 18. Each chip 18 has an annular body 20, a plurality of pads 22 and a micro mechanism 24 thereon. The material of the annular body 20 is usually epoxy resin.

The micro mechanism 24 is disposed in the cavity defined by the annular body 20, and can be a micro active device (for example, integrated circuit, micro mechanical device or moving device) or a micro passive device (for example, sensor, capacitor or resistor). Taking a microlens set for example, the microlens set comprises: a supporting portion 241, a hinge 242 and a microlens 243. One end of the supporting portion 241 is connected to the chip 18. The hinge 242 is disposed at the other end of the supporting portion 241. One end of the microlens 243 is connected to the hinge 242 so that the hinge 242 can be a rotating center of the microlens 243.

The pads 22 are disposed outside the cavity defined by the annular body 20 and are used for electrically connecting to an outside circuit (not shown in the figure) after dicing process.

Then, a second wafer 25 having an upper surface 28 and a lower surface 26 is provided. Then, the second wafer 25 is covered and joined to the first wafer 10, and the lower surface 26 of the second wafer 25 faces the active surface 12 of the first wafer 10 to form a plurality of cavities defined by the annular body 20. The micro mechanism 24 is inside the cavity.

Finally, the first wafer 10 and the second wafer 25 are diced by utilizing the blade 34,36 to form a wafer level package structure 38 having a cavity.

In the conventional method, the lower surface 26 of the second wafer 25 faces the active surface 12 of the first wafer 10, and the process of dicing the first wafer 10 from its backside surface 14 would be very difficult because the scribe lines 16 are on the active surface 12 and the first wafer 10 is opaque.

Consequently, there is an existing need for a novel and improved method of making a package structure to solve the above-mentioned problem.

SUMMARY OF THE INVENTION

One objective of the present invention is to dice a wafer from its active surface to form two perpendicular reference axes and a reference coordinate, and then to dice the wafer from its backside surface according to the reference coordinate so as to reduce the manufacture time and facilitate positioning.

Another objective of the present invention is to provide a method of making a package structure comprising:

(a) providing a first wafer having an active surface and a backside surface, the active surface having a plurality of scribe lines defining a plurality of chips, wherein each chip has an annular body thereon;

(b) dicing the first wafer from the active surface to form a first reference axis and a second reference axis, wherein the first reference axis and the second reference axis have a predetermined distance from the chips respectively, and the first reference axis is perpendicular to the second reference axis so as to form a reference coordinate;

(c) providing a second wafer having an upper surface and a lower surface;

(d) covering and joining the second wafer to the first wafer, wherein the lower surface of the second wafer faces the active surface of the first wafer to form a plurality of cavities defined by the annular body; and (e) dicing the corresponding positions of the scribe lines of the first wafer from the backside surface thereof according to the predetermined distance from the reference coordinate so as to form an individual package structure.

DETAILED DESCRIPTION OF THE INVENTION

According to the present invention, the method of making a wafer level package structure having a cavity comprises the following steps. In the accompanying drawings, the same elements in different drawings are designated with same reference numbers.

Figure 1:
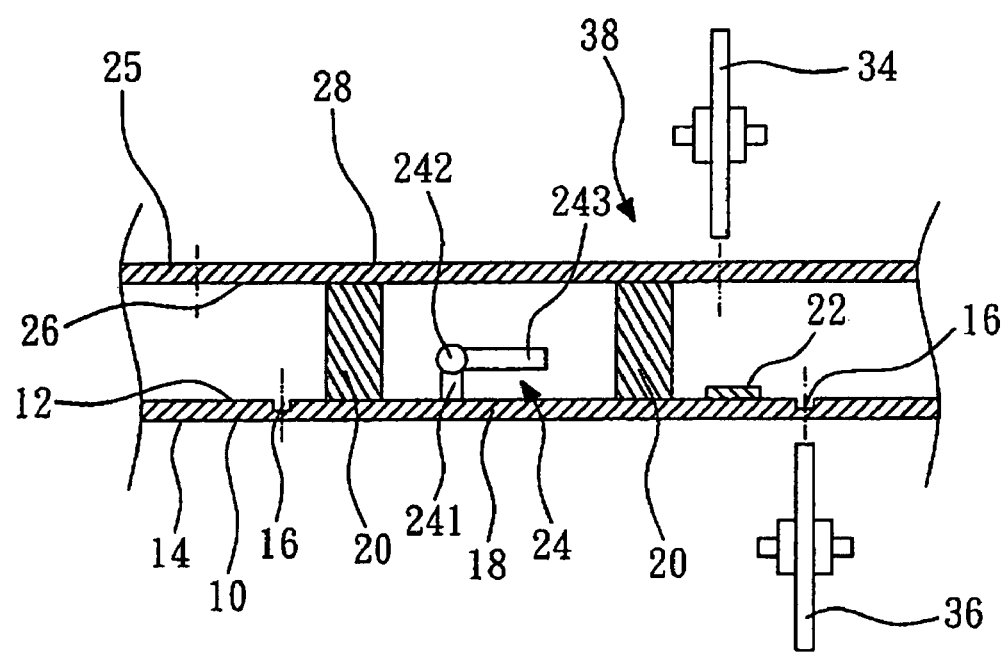
FIG. 1 shows a cross sectional view of a conventional wafer level package structure.
Figure 2:
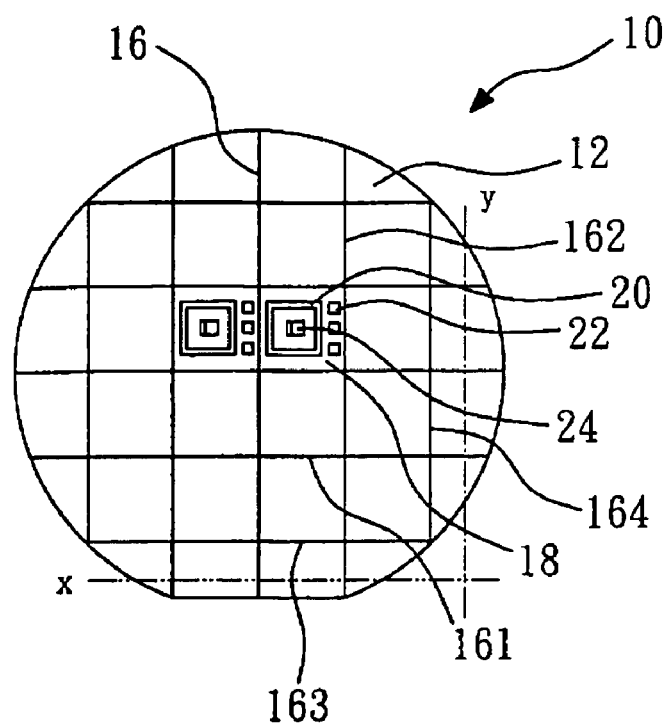
FIG. 2 shows a top view of a first wafer according to the first embodiment of the present invention.

FIG. 2 shows a top view of a first wafer 10 according to the first embodiment of the present invention. The first wafer 10 might be a silicon wafer. Referring to FIGS. 1 and 2, the first wafer 10 has an active surface 12 and a backside surface 14, wherein the active surface 12 has a plurality of scribe lines 16. The scribe lines 16 comprise a plurality of first scribe lines 161 (along x direction in the figure) and a plurality of second scribe lines 162 (along y direction in the figure) orthogonal to each other so as to define a plurality of chips 18. The chip 18 might be a CMOS chip and has an annular body 20, a plurality of pads 22 and a micro mechanism 24 thereon. The material of the annular body 20 is usually epoxy resin.

The micro mechanism 24 is disposed in the cavity defined by the annular body 20, and can be a micro active device (for example, integrated circuit, micro mechanical device or moving device) or a micro passive device (for example, sensor, capacitor or resistor). Taking a microlens set for example, the microlens set comprises: a supporting portion 241, a hinge 242 and a microlens 243. One end of the supporting portion 241 is connected to the chip 18. The hinge 242 is disposed at the other end of the supporting portion 241. One end of the microlens 243 is connected to the hinge 242 so that the hinge 242 can be a rotating center of the microlens 243. The microlens set is disposed on a memory unit (not shown in the figure) of the CMOS chip 18. The memory unit can control the rotation of the corresponding microlens 243.

The pads 22 are disposed outside the cavity defined by the annular body 20 and are used for electrically connecting to an outside circuit (not shown in the figure) after dicing process.

Figure 3:
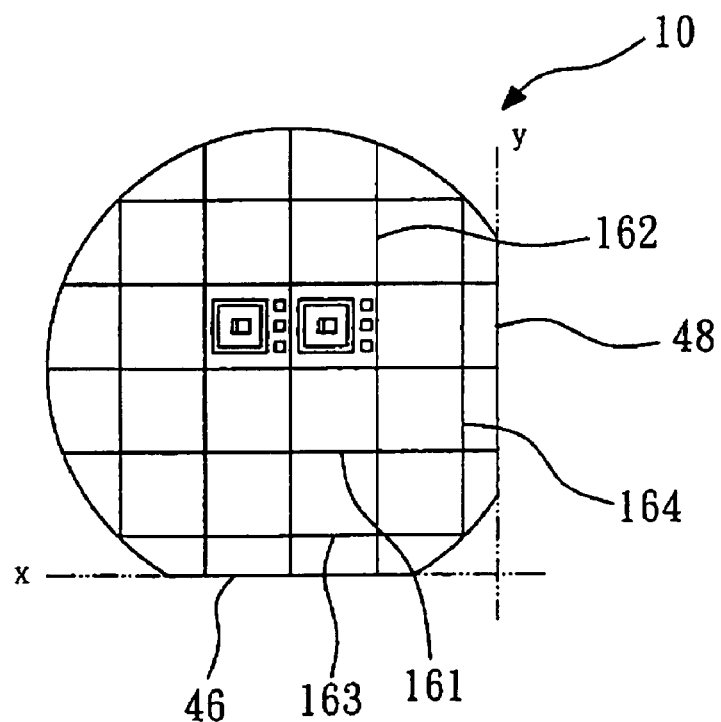
FIG. 3 shows that the first wafer of FIG. 2 is cut from its active surface to form a reference coordinate.

Referring to FIG. 3, the first wafer 10 is cut from its active surface 12. The cutting process is described as follows. A part of the periphery of the bottom of the first wafer 10 is cut away according to a predetermined distance from the lowest first scribe line 163 by utilizing a blade so as to form a chamfer 46 that is parallel to the first scribe lines 161. The chamfer 46 and its extension direction are defined as a first reference axis, i.e., x-axis. Then, a part of the periphery of the right side of the first wafer 10 is cut away according to a predetermined distance from the rightmost second scribe line 164 by utilizing a blade so as to form a chamfer 48 that is parallel to the second scribe lines 162. The chamfer 48 and its extension direction are defined as a second reference axis, i.e., y-axis. The second reference axis is perpendicular to the first reference axis so as to form a reference coordinate.

Referring to FIG. 1 again, a second wafer 25 is provided. The second wafer 25 might be a transparent glass wafer and has an upper surface 28 and a lower surface 26. In this embodiment, the above-mentioned micro mechanism 24 is disposed on the chip 18. Alternatively, the micro mechanism 24 can be disposed on the lower surface 26 of the second wafer 25.

Then, the second wafer 25 is covered and joined to the first wafer 10, wherein the lower surface 26 of the second wafer 25 faces the active surface 12 of the first wafer 10 to form a plurality of cavities defined by the annular body 20. The micro mechanism 24 is inside the cavity. In this embodiment, the first wafer 10 and the second wafer 25 are joined by hot pressing. However, it is understood that the first wafer 10 and the second wafer 25 can be joined by any conventional way.

Figure 4:
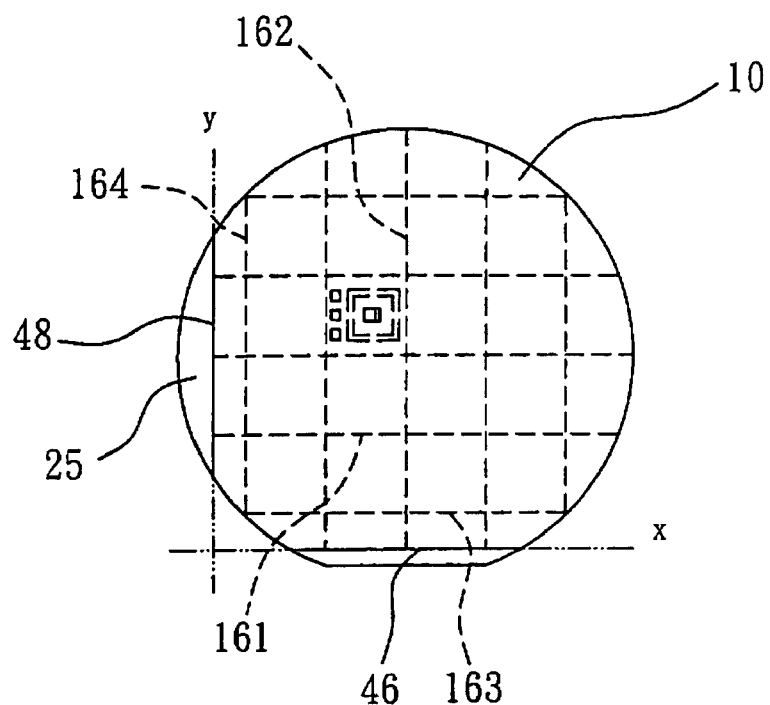
FIG. 4 shows a bottom view of the first wafer of FIG. 3 covered by the second wafer.

FIG. 4 shows a bottom view of the first wafer 10 covered by the second wafer 25. As shown in the figure, the corresponding positions of the scribe lines 16 of the first wafer 10 is diced from its backside surface 14 according to the predetermined distance from the reference coordinate. For example, if dicing is applied to x direction, the blade moves upward in a above-mentioned predetermined distance so as to dice the corresponding position of the lowest first scribe line 163. Further, the blade moves upward in the width of the chip 18 so as to dice the corresponding position of the next first scribe line. In the same way, dicing is applied to y direction. It should be noted that the depth of dicing is smaller than the thickness of the first wafer 10, that is, the blade does not segment the first wafer 10.

Then, because the second wafer 25 is a transparent glass wafer, it can be diced from its upper surface 28 according to the scribe lines 16 of the first wafer 10. It should be noted that the depth of dicing is smaller than the thickness of the second wafer 25, that is, the blade does not segment the second wafer 25.

Finally, the first wafer 10 and the second wafer 25 are broken by mechanical work such as external force or vibration to form an individual package structure 38.

Figure 5:
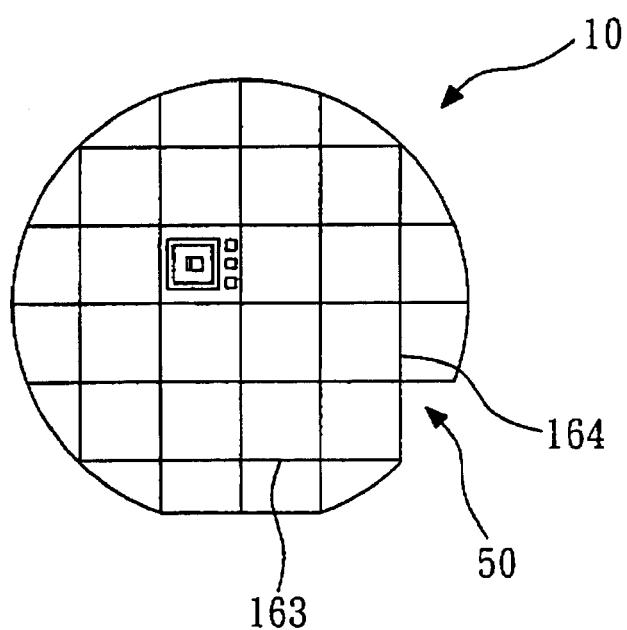
FIG. 5 shows a top view of a first wafer according to the second embodiment of the present invention.

FIG. 5 shows a top view of a first wafer according to the second embodiment of the present invention. This embodiment is substantially similar to the first embodiment except for the way of cutting the first wafer. In this embodiment, a lacuna 50 is formed by cutting a fan-shaped part with a inclination angle of ninety degrees of the first wafer at a predetermined position. Two sides of the lacuna 50 are perpendicular to each other and form a reference coordinate, and the two sides of the lacuna 50 are parallel to the first scribe lines 163 and the second scribe lines 164 respectively.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A method of making a package structure comprising:
   (a) providing a first wafer having an active surface and a backside surface, the active surface having a plurality of scribe lines defining a plurality of chips, wherein each chip has an annular body thereon;
   (b) dicing the first wafer from the active surface to form a first reference axis and a second reference axis, wherein the first reference axis and the second reference axis have a predetermined distance from the chips respectively, and the first reference axis is perpendicular to the second reference axis so as to form a reference coordinate;
   (c) providing a second wafer having an upper surface and a lower surface;
   (d) covering and joining the second wafer to the first wafer, wherein the lower surface of the second wafer faces the active surface of the first wafer to form a plurality of cavities defined by the annular body; and
   (e) dicing the corresponding positions of the scribe lines of the first wafer from the backside surface thereof according to the predetermined distance from the reference coordinate so as to form an individual package structure.

2. The method according to claim 1, wherein each chip is a CMOS chip.

3. The method according to claim 2, wherein each chip further comprises a plurality of pads that are disposed outside the cavity defined by the annular body and are used for electrically connecting to an outside circuit after dicing process.

4. The method according to claim 2, wherein each chip further comprises a micro mechanism that is disposed in the cavity and is connected to the chip.

5. The method according to claim 4, wherein the micro mechanism comprises at least one microlens set, each microlens set comprising:
   a supporting portion having one end connected to the chip;
   a hinge disposed at the other end of the supporting portion; and
   a microlens having one end connected to the hinge.

6. The method according to claim 1, wherein the material of the annular body comprises epoxy resin.

7. The method according to claim 1, wherein the scribe lines comprise a plurality of first scribe lines and a plurality of second scribe lines orthogonal to each other, the first reference axis is parallel to the first scribe lines, and the second reference axis is parallel to the second scribe lines.

8. The method according to claim 1, wherein the first reference axis and the second reference axis are chamfers formed by cutting parts of the first wafer.

9. The method according to claim 1, wherein the first reference axis and the second reference axis are two sides of a lacuna formed by cutting a fan-shaped part with a inclination angle of ninety degrees of the first wafer.

10. The method according to claim 1, wherein the first wafer is a silicon wafer and the second wafer is a transparent glass wafer.

11. The method according to claim 1, wherein the second wafer further comprises a plurality of micro mechanisms on the lower surface thereof, each micro mechanism being disposed in each cavity and connected to the second wafer.

12. The method according to claim 11, wherein the micro mechanism comprises at least one microlens set, each microlens set comprising:
   a supporting portion having one end connected to the second wafer;
   a hinge disposed at the other end of the supporting portion; and
   a microlens having one end connected to the hinge.

13. The method according to claim 1, wherein the first wafer and the second wafer are joined by hot pressing in step (d).

14. The method according to claim 1, wherein the depth of dicing is smaller than the thickness of the first wafer in step (e), and step (e) further comprises:
   (e1) dicing the second wafer from the upper surface thereof, wherein the depth of dicing is smaller than the thickness of the second wafer; and
   (e2) breaking the first and second wafers to form an individual package structure.

15. A method of making a package structure comprising:
   (a) providing a silicon wafer having an active surface and a backside surface, the active surface having a plurality of first scribe lines and second scribe lines orthogonal to each other so as to define a plurality of CMOS chips;
   (b) dicing a part of the silicon wafer from the active surface thereof along two perpendicular directions so that the silicon wafer has a reference coordinate with a first chamfer and a second chamfer perpendicular to each other, wherein the first chamfer is parallel to the first scribe lines, the second chamfer is parallel to the second scribe lines, the first and second chamfers have a predetermined distance from the chips respectively;
   (c) providing a glass wafer having an upper surface and a lower surface;
   (d) covering and joining the glass wafer to the silicon wafer, wherein the lower surface of the glass wafer faces the active surface of the silicon wafer to form a plurality of cavities;
   (e) dicing the corresponding positions of the scribe lines of the silicon wafer from the backside surface thereof according to the predetermined distance from the reference coordinate, wherein the depth of dicing is smaller than the thickness of the silicon wafer;
   (f) dicing the glass wafer from the upper surface thereof according to the scribe lines of the silicon wafer, wherein the depth of dicing is smaller than the thickness of the glass wafer; and
   (g) breaking the silicon wafer and glass wafer to form an individual package structure.

16. The method according to claim 15, wherein each CMOS chip has an annular body, a plurality of pads and a micro mechanism thereon, wherein the micro mechanism is disposed in the cavity defined by the annular body, the pads are disposed outside the cavity defined by the annular body and are used for electrically connecting to an outside circuit after dicing process.

17. The method according to claim 16, wherein the micro mechanism comprises at least one microlens set, each microlens set comprising:
   a supporting portion having one end connected to the CMOS chip;
   a hinge disposed at the other end of the supporting portion; and
   a microlens having one end connected to the hinge.

18. The method according to claim 15, wherein the glass wafer further comprises a plurality of micro mechanisms on the lower surface thereof, each micro mechanism being disposed in each cavity and connected to the glass wafer.

19. The method according to claim 18, wherein the micro mechanism comprises at least one microlens set, each microlens set comprising:
   a supporting portion having one end connected to the glass wafer;
   a hinge disposed at the other end of the supporting portion; and
   a microlens having one end connected to the hinge.

20. A method of dicing a wafer from the backside surface thereof, comprising:
   (a) providing a wafer having an active surface and a backside surface, the active surface having a plurality of first scribe lines and second scribe lines orthogonal to each other so as to define a plurality of chips;
   (b) dicing a part of the wafer from the active surface thereof along two perpendicular directions so that the wafer having a reference coordinate with a first chamfer and a second chamfer perpendicular to each other, wherein the first chamfer is parallel to the first scribe lines, the second chamfer is parallel to the second scribe lines, and the first and second chamfers have a predetermined distance from the chips respectively; and
   (c) dicing the corresponding positions of the scribe lines of the silicon wafer from the backside surface thereof according to the predetermined distance from the reference coordinate.

21. A method of making a package structure comprising:
   (a) providing a first wafer having an active surface, a backside surface and a reference coordinate, the active surface having a plurality of scribe lines defining a plurality of chips, wherein each chip has an annular body thereon, the reference coordinate comprising a first reference axis and a second reference axis, wherein the first reference axis and the second reference axis have a predetermined distance from the chips respectively;
   (b) providing a second wafer having an upper surface and a lower surface;
   (c) covering and joining the second wafer to the first wafer, wherein the lower surface of the second wafer faces the active surface of the first wafer to form a plurality of cavities defined by the annular body; and
   (d) dicing the corresponding positions of the scribe lines of the first wafer from the backside surface thereof according to the predetermined distance from the reference coordinate so as to form an individual package structure.

22. The method according to claim 21, wherein each chip further comprises a micro mechanism that is disposed in the cavity and is connected to the chip, the micro mechanism comprising at least one microlens set, each microlens set comprising:

a supporting portion having one end connected to the chip;

a hinge disposed at the other end of the supporting portion; and a microlens having one end connected to the hinge.

23. The method according to claim 21, wherein the scribe lines comprise a plurality of first scribe lines and a plurality of second scribe lines orthogonal to each other, the first reference axis is parallel to the first scribe lines, and the second reference axis is parallel to the second scribe lines.

24. The method according to claim 21, wherein the depth of dicing is smaller than the thickness of the first wafer in step (d), and step (d) further comprises:

(d1) dicing the second wafer from the upper surface thereof, wherein the depth of dicing is smaller than the thickness of the second wafer; and (d2) breaking the first and second wafers to form an individual package structure.

* * * * *